United States Patent [19]

Kawagai et al.

[11] 4,151,546

[45] Apr. 24, 1979

[54] SEMICONDUCTOR DEVICE HAVING ELECTRODE-LEAD LAYER UNITS OF DIFFERING THICKNESSES

[75] Inventors: Kenji Kawagai; Shigeki Yoshida, both of Kawasaki; Yasuo Nakada, Yokohama, all of Japan

[73] Assignee: Tokyo Shibaura Electric Co., Ltd., Tokyo, Japan

[21] Appl. No.: 937,569

[22] Filed: Aug. 28, 1978

Related U.S. Application Data

[63] Continuation of Ser. No. 759,135, Jan. 13, 1977, abandoned.

[51] Int. Cl.² .................. H01L 23/48; H01L 29/46; H01L 29/54
[52] U.S. Cl. ........................... 357/71; 357/65; 357/67; 357/68; 29/589
[58] Field of Search .............. 357/65, 68, 71, 72, 357/67; 29/589

[56] References Cited

U.S. PATENT DOCUMENTS

| | | | |
|---|---|---|---|
| 3,641,661 | 2/1972 | Canning et al. | 357/68 |
| 3,771,026 | 11/1973 | Asai et al. | 357/68 |
| 3,795,974 | 3/1974 | Calhoun | 357/72 |
| 3,801,880 | 4/1974 | Harada et al. | 357/71 |
| 3,838,442 | 9/1974 | Humphreys | 357/71 |
| 3,932,880 | 1/1976 | Nara et al. | 357/67 |
| 3,946,426 | 3/1976 | Sanders | 357/71 |
| 3,993,515 | 11/1976 | Reichert | 357/71 |
| 4,017,886 | 4/1977 | Tomono et al. | 357/71 |

*Primary Examiner*—Andrew J. James
*Attorney, Agent, or Firm*—Finnegan, Henderson, Farabow & Garrett

[57] ABSTRACT

A semiconductor device comprising electrode-lead layer units wherein at least one of said electrode-lead layer units or at least one portion of same of said units occupying certain positions in the semiconductor device is made thicker than the remainder, thereby enabling circuit elements to be integrated with a high density, namely, rendering the entire semiconductor device compact.

5 Claims, 4 Drawing Figures

SEMICONDUCTOR DEVICE HAVING ELECTRODE-LEAD LAYER UNITS OF DIFFERING THICKNESSES

This is a continuation of application Ser. No. 759,135, filed Jan. 13, 1977 and now abandoned.

BACKGROUND OF THE INVENTION

This invention relates to improvements an electrode-lead layer units included in a semiconductor device and more particularly to electrode-lead layer units included in a giant scale integrated circuit (abbreviated as "GSI circuit") contaning extremely fine lead layers and also electrode-lead layer units used with a metal oxide semiconductor field effect transistor (abbreviated as "MOS FET") through which a large amount of current flows.

The prior art MOS FET is constructed, for example, with such a cross section as shown in FIG. 1. Formed in an N-type or P-type semiconductor substrate 1 are a source region 2 and drain region 3 by diffusion of impurities with the opposite type of conductivity to the semiconductor substrate. A thin gate oxide layer 4 and field oxide layer 5 are provided, for example, by oxidation or gas phase growth. A conductive layer made of, for example, aluminium is laminated all over the above-mentioned deposited elements by evaporation or gas phase growth, followed by selective etching to provide a source electrode 6, gate electrode 7 and lead layer 8 etc. Mounted on said assembled mass is an insulating layer (not shown) prepared from, for example, silicate glass containing phosphorus or boron. The electrode-lead layer unit has a width of several or scores of microns and a thickness of several microns. The gate electrode 7 through which little current runs can be made narrower than the source electrode 6 and drain electrode (not shown). However, the electrode-lead layer unit has a substantially uniform thickness.

The electrode-lead layer unit should preferably be made narrow to integrate MOS FET's with high density or render an entire semiconductor device compact. Hitherto, however, considerable difficulties have been encountered in consideration of etching precision and current capacity in reducing the width of source and drain electrodes and lead layers connected thereto, where a relatively large amount of current is allowed to pass through these electrodes and lead layers. For instance, an attempt to make a lead layer narrow, particularly about as narrow as its thickness tends to cause the lead layer to be easily broken during crosswise etching. Conversely, an attempt to restrict the degree of etching for prevention of the breakage of the lead layer is likely to engender short-circuiting between adjacent lead layers. Further, if a lead layer is made thin to elevate etching precision, then the current capacity of the lead layer will decrease, and passage of excess current will lead to the breakage of the lead layer. Accordingly, it has been impossible to decrease not only the width of an input lead layer connected to a power source and output lead layer, but also that of source and drain electrodes, to a lower level than that which corresponds to an amount of current passing through these elements. The above-mentioned problems arise not only with a GSI circuit which contains circuit elements integrated with as high a density as tens of thousands per square millimeter and for which lead layers used are only allowed to have a width ranging from several microns to several thousand Angstrom units, but also with any other form of semiconductor device.

Where a lead layer is formed on a semiconductor substrate by evaporating, for example, an aluminium conductor, there has hitherto occurred the drawback that no thermal deposition takes place in an uneven boundary region on the surface of a substrate which results from formation of an oxide layer, namely, on the inner wall of an etched hole, possibly giving rise to the breakage of the lead layer. Even if thermal deposition of the lead layer does take place, part of the lead layer is likely to be removed by the subsequent etching with the resultant breakage, unless the lead layer has a uniform large thickness. Therefore, a customary practice to resolve the above-mentioned difficulty has been to cause the inner wall of the etched hole to be inclined upward at an angle of about 20° to 25° to a horizontal plane in order to attain full thermal deposition of the lead layer. Though a gentler inclination of the inner wall of the etched hole is less likely to cause the breakage of the lead layer, yet said inclination, regardless of the angle thereof, presents difficulties in integrating numerous circuit elements with an increased density or rendering an entire semiconductor device more compact.

A lead pad intended to be connected to an external lead terminal by means of, for example, a gold wire has hitherto been accompanied with the drawback of being readily broken by a mechanical force applied during said wire bonding, because said lead pad has an insufficient thickness.

SUMMARY OF THE INVENTION

It is accordingly an object of this invention to provide a semiconductor device which enables a large number of circuit elements to be integrated with a high density by improving electrode-lead layer units, thereby rendering the whole of the semiconductor device compact.

Another object of the invention is to provide a semiconductor device containing electrode-lead layer units which are little likely to be broken even if made narrower than has been possible in the past.

The other objects and advantages of the present invention will become apparent as the invention is more thoroughly discussed hereinafter.

To attain the above-mentioned objects, the invention provides a semiconductor device comprising electrode-lead layer units, wherein at least one of said electrode-lead layer units or at least one portion of some of the units occupying certain positions in the semiconductor device is made thicker than the remainder, thereby enabling the thicker portion to be made correspondingly narrower.

A preferred embodiment of this invention is a semiconductor device comprising a semiconductor substrate in which a desired semiconductor region is formed; electrodes mounted on said semiconductor substrate; and lead layers provided on said substrate with an insulating layer interposed therebetween, wherein at least one of numerous electrode-lead layer units, at least one portion of some of the units or a combination thereof is respectively formed of a first conductive layer and a second conductive layer laminated thereon.

DETAILED DESCRIPTION OF THE INVENTION

Figure 2:
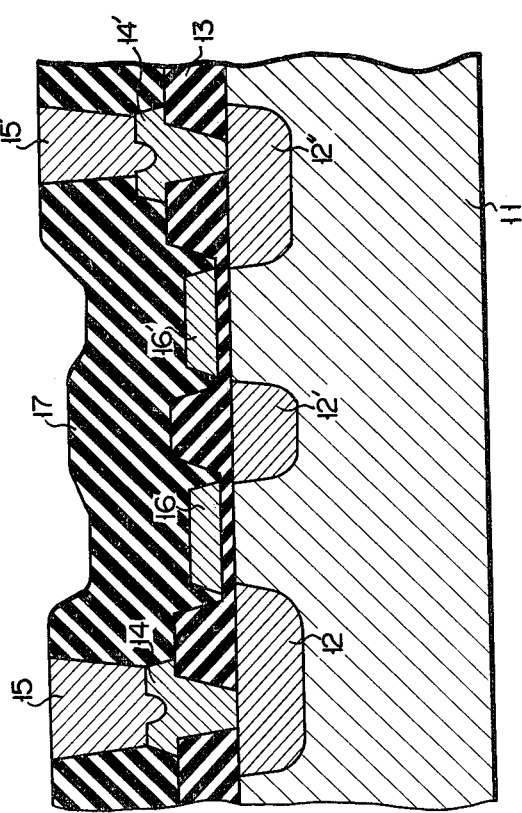
FIG. 2 is a fractional cross sectional view of an MOS FET embodying this invention.

Referring to FIG. 2 showing a semiconductor device according to one embodiment of this invention, for example, a source electrode-lead layer unit is formed of a first conductive layer 14 and a second conductive layer 15 laminated thereon. For example, a drain electrode-lead layer unit comprises a first conductive layer 14' and a second conductive layer 15' laminated thereon. The electrode portions of the electrode-lead layer units are formed on the substrate 11, whereas the lead layer portions of said units are formed on the oxide layer 13 and extend to the lead pads.

Gate electrodes 16, 16' receive little current and need not have a double-layer construction as described above. A conductor constituting the electrodes and lead layers may be prepared from the customary material such as aluminum, molybdenum or polycrystalline silicon.

Prescribed semiconductor regions 12, 12', 12'' are formed in a semiconductor substrate 11 according to the conventional method. An insulation oxide layer 13 is formed on the semiconductor substrate 11 by gas phase growth and thermal oxidation. The insulation oxide layer 13 is partly etched to provide contact holes for electrodes. A conductor of, for example, aluminium is mounted all over the surface by evaporation or sputtering. The aluminium conductor thus formed is etched to provide first conductive layers 14, 14' of the electrode-lead layer units. At this time, gate electrodes 16, 16' are also formed. Where the above-mentioned conductor consists of polycrystalline silicon instead of aluminium, said conductor is formed by gas phase growth. Later, at least one insulation layer 17 is deposited all over the assembled mass by gas phase growth, evaporation or sputtering. The insulation layer 17 may be of the known type, such as silicon oxide ($SiO_2$), silicon nitride ($Si_3N_4$) and silicate glass doped with at least one selected from the group consisting of lead, boron, arsenic and phosphorus etc. Thereafter, those parts of the insulation layer 17 which cover the first conductive layer 14, 14' are removed to expose said conductor layers 14, 14'. Again, a conductor of, for example, aluminium is deposited all over the assembled mass by evaporation or sputtering with a sufficient thickness. Thereafter, etching is applied to remove the other portions of said conductor than those which are laminated on the first conductor layers 14, 14', the remaining laminated portions of said conductor being used as second conductive layers 15, 15'. Preferably, the upper surfaces of the second conductive layers 15, 15' are made at least flush with the upper surface of the insulation layer 17 whose grooves are filled with said second conductive layers 15, 15'. The exposed second conductive layers 15, 15' may be covered with an another insulation layer for protection.

With the semiconductor device of this invention, the electrode-lead layer unit which is made thicker than has been possible in the past can be made narrower than before. The width and thickness of the electrode-lead layer unit can be easily selected by those skilled in the art according to an amount of current passing through said unit.

Figure 3:
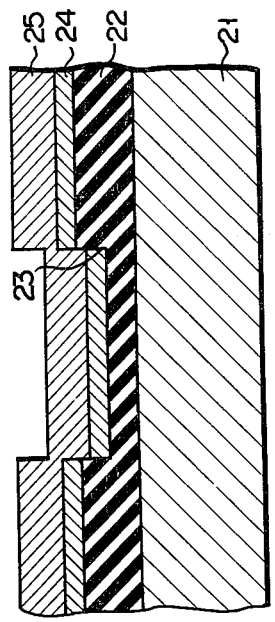
FIG. 3 is a fractional cross sectional view of that portion of the present semiconductor device which extends along one lead layer.

There will now be described a semiconductor device according to another embodiment of this invention by reference to FIG. 3 showing a cross section of said semiconductor device. An insulation oxide film 22 formed on a semiconductor substrate 21 is provided with an etched hole. It sometimes happens that as seen from FIG. 3, a first conductive layer 24 of a lead layer is not deposited on the inner wall 23 of the etched hole. However, a second conductive layer 25 laminated on said first conductive layer 24 prevents the breakage of the lead layer assembly.

Figure 4:
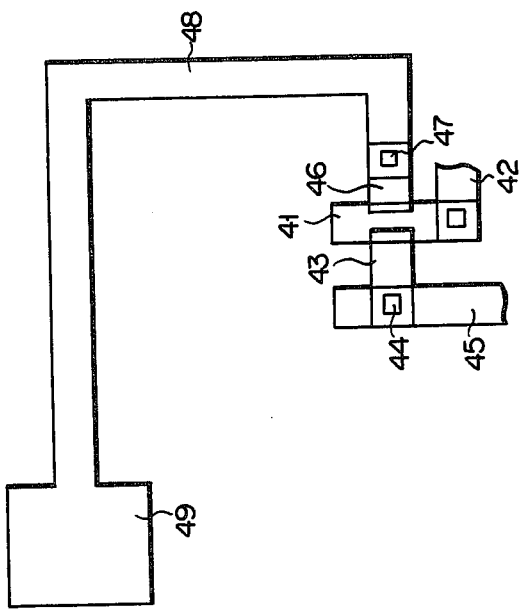
FIG. 4 is a fractional plan view of the present semiconductor device, showing the electrodes lead layers and diffusion regions.
Figure 1:
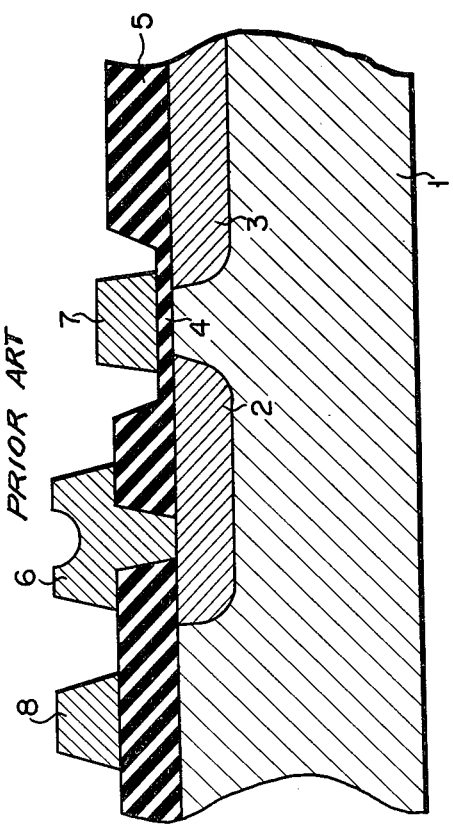
FIG. 1 is a fractional cross sectional view of the prior art MOS FET.

According to this invention, the electrode-lead layer unit may be thickened along the full length thereof. Or it is possible to thicken only a part such as a power supply lead layer through which a large amount of current flows or a prominently uneven portion of the upper surface of a semiconductor substrate. There will now be described this thickening process by reference to FIG. 4 fractionally presenting a plan view of a MOS FET used with the semiconductor device of this invention. Referential numeral 41 denotes a gate electrode; 42 a lead layer connected thereto; 43 a drain region; 44 a drain electrode; 45 a lead layer connected thereto; 46 a source region; 47 a source electrode; 48 a lead layer connected thereto; and 49 a lead pad constituting the end portion of the lead layer 48. For example, the source electrode 47 and the lead layer 48 (including the lead pad 49) connected thereto jointly form a double-layer conductor proposed in this invention. If this double-layer conductor is made, for example, twice as thick as that used with the prior art semiconductor device, then said double-layer conductor can have its width decreased to substantially half of that level which has been required in the past.

The electrode-lead layer unit which has been thickened by lamination of the component elements according to this invention admits of an increase in the current capacity of the electrode-lead layer unit without enlarging the width or area of said unit and also can be saved from breakage. Or it is possible to integrate circuit elements included in the semiconductor device of this invention with a higher density by reducing the width of the electrode-lead layer unit with the current capacity thereof unchanged or thereby to render the semiconductor device compact as a whole. Further, an element of the semiconductor device such as a lead pad which is liable to be easily broken by an external force can be reinforced by being thickened, thereby providing a semiconductor device containing a mechanically strong lead layer. If a lead layer is thickened according to this invention, then it is possible to prevent the breakage of the lead layer without causing the inner wall of an etched hole to be inclined at a considerable angle.

What we claim is:

1. In a semiconductor device comprising a semiconductor substrate having semiconductor regions, an insulation layer, and electrode-lead layer units including electrode portions, lead pad portions and lead layer portions between and interconnecting said electrode portions and said lead pad portions;

the improvement wherein at least one portion of at least one electrode-lead layer unit comprises a first conductive layer and a second conductive layer directly laminated on the whole outer surface of said first conductive layer.

2. The semiconductor device according to claim 1, wherein the first and second conductive layers are made of one material selected from the group consisting of aluminum, molybdenum and polycrystalline silicon.

3. The semiconductor device according to claim 1, which comprises a metal oxide semiconductor field effect transistor in which the source electrode portion, drain electrode portion and lead layer portions connected thereto are each formed of first and second conductive layers.

4. The semiconductor device according to claim 2, wherein the first and second conductive layers are made of aluminum.

5. In a semiconductor device comprising a semiconductor substrate having semiconductor regions, an insulation layer, and electrode-lead layer units including electrode portions, lead pad portions and lead layer portions between and interconnecting said electrode portions and said lead pad portions;

the improvement wherein at least one lead pad portion comprises a first conductive layer and a second conductive layer directly laminated on the whole outer surface of said first conductive layer.

* * * * *

UNITED STATES PATENT AND TRADEMARK OFFICE
CERTIFICATE OF CORRECTION

PATENT NO. : 4,151,546
DATED : April 24, 1979
INVENTOR(S) : KENJI KAWAGAI, SHIEGEKI YOSHIDA, YASUO NAKADA It is certified that error appears in the above-identified patent and that said Letters Patent are hereby corrected as shown below:

First page, after filing date, the Foreign Application Priority Data has not been printed. Please add:

-- January 14, 1976  Japan  51-3402 --.

Signed and Sealed this

Thirteenth Day of November 1979

[SEAL]

Attest:

RUTH C. MASON
*Attesting Officer*

LUTRELLE F. PARKER
*Acting Commissioner of Patents and Trademarks*